(12) United States Patent
Tanaka et al.

(10) Patent No.: US 6,478,878 B1
(45) Date of Patent: Nov. 12, 2002

(54) BLASTING MEDIUM AND BLASTING METHOD

(75) Inventors: Masaharu Tanaka, Ichihara (JP); Hachiro Hirano, Ichihara (JP); Makoto Yoshida, Kitakyushu (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 09/536,682

(22) Filed: Mar. 28, 2000

(30) Foreign Application Priority Data

Mar. 29, 1999 (JP) ............................ 11-086343

(51) Int. Cl.⁷ .............................. B08B 7/00; B24C 1/00; C09C 1/68
(52) U.S. Cl. ................... 134/7; 134/6; 51/307; 51/308; 451/36; 451/37; 451/38
(58) Field of Search ............................ 134/6, 7; 51/307, 51/308; 451/36, 37, 38

(56) References Cited

U.S. PATENT DOCUMENTS

| 5,308,404 A | 5/1994 | Yam et al. |
| 5,509,971 A | 4/1996 | Kirschner |
| 5,827,114 A | 10/1998 | Yam et al. |
| 6,010,546 A | 1/2000 | Hirano et al. |
| 6,207,123 B1 * | 3/2001 | Tanaka et al. .............. 423/421 |

FOREIGN PATENT DOCUMENTS

WO  WO 90/11163  10/1990

OTHER PUBLICATIONS

"Sand Blasting Machine Exclusive for Substrate" by Katsurou Hiratsuka in "Electronic Materials", Oct. 1998 (w/Partial Translation (p. 91, left col., lines 19–32).

* cited by examiner

Primary Examiner—Zeinab El-Arini
(74) Attorney, Agent, or Firm—Oblon, Spivak, McClelland, Maier & Neustadt, P.C.

(57) ABSTRACT

A blasting medium which has an average grain size of at most 20 $\mu m$ and contains at least 90 mass % of a water-soluble inorganic salt, wherein the content of grains having grain sizes of at least 50 $\mu m$ is at most 5 mass %.

17 Claims, 1 Drawing Sheet

BLASTING MEDIUM AND BLASTING METHOD

The present invention relates to a blasting medium and a blasting method. Particularly, it relates to a blasting medium and a blasting method, whereby fine processing is possible without bringing about excessive damages or functional deterioration to the object to be treated, and even when the medium remains on the object to be treated, it can readily be removed.

In recent years, along with the progress of electronic engineering, integration and accelerating of computing functions have been advanced with respect to electronic equipments such as computers. Multilayer interconnection boards are not exception, and various multilayer interconnection boards have been developed which make high density wiring or high density packaging possible.

As a method for forming such multilayer interconnection boards, a production method by a build up method is known wherein via holes are formed to electrically connect an upper layer wiring pattern and a lower layer wiring pattern. In this method for production of multilayer interconnection boards by a build up method, it takes time for forming via holes, and work efficiency is poor. In order to overcome such a drawback, a system has been proposed wherein an interlayer insulation layer made of a resin composition is selectively irradiated with a high power laser beam such as a carbon dioxide gas laser beam or an excimer laser beam to thermally decompose, dissipate and remove optional portions of the interlayer insulation layer by the laser beam thereby to form via holes.

FIG. 1 illustrates a multilayer interconnection board having via holes formed in an interlayer insulation layer by means of a laser beam according to this system. Referring to FIG. 1, a wiring pattern 3 of from about 1 to 200 $\mu$m is formed on a substrate 1. Then, an interlayer insulating layer 5 is formed thereon. Thereafter, optional positions of the interlayer insulating layer 5 are treated for thermal decomposition, etc. by a laser beam to form via holes 7.

By the introduction of such a system, formation of via holes 7 can be completed in a relatively short period of time, and the work efficiency has been substantially improved. However, part of the interlayer insulation layer which has been thermally decomposed, dissipated and removed is likely to re-attach or deposit on the inner walls or peripheral portions of the via holes 7 to form smears 9. Such smears 9 bring about drawbacks such that they cause failure in electrical conduction to a lower layer wiring pattern during treating treatment, or they may change the thickness of the interlayer insulation layer 5.

To overcome such drawbacks, it has been proposed to immerse the substrate 1 having via holes 7 formed, in a smear-removing liquid. However, with a conventional smear-removing liquid, it has been difficult to completely remove smears 9, and it has had a problem that the liquid tends to deteriorate the interlayer insulation layer 5.

Further, if an interlayer insulation layer 5 made of an epoxy resin composition containing inorganic fibers of e.g. glass, is irradiated with a high power laser beam, only the resin portion tends to be removed, and the inorganic fibers tend to be exposed in via holes 7, whereby it has been difficult to form an electrically conductive layer. Further, such exposed fibers can hardly be removable by means of the smear-removing liquid, whereby it has been extremely difficult to form a good conductive layer.

On the other hand, smear treatment by means of a blast material is also known. As is different from the case where a smear-removing liquid is employed, this treatment is very effective to cleanly remove smears 9 and exposed inorganic fibers and to form via holes 7 with excellent configuration.

However, especially when via holes 7 of not larger than 100 $\mu$m are to be treated by a blasting method, with a conventional blasting material such as glass beads, alumina, silica, silicon carbide or zirconium oxide, such a blasting material is likely to collect and clog via holes 7 and can hardly be completely removed even by a subsequent washing process, thus leading to failure in forming a good conductive layer.

The present invention has been made in view of such problems of the prior art, and it is an object of the present invention to provide a water-soluble blasting medium and a blasting method, whereby fine processing is possible without bringing about excessive damages or functional deterioration to an object to be treated, and even if the medium remains on the object to be treated, it can readily be removed.

That is, the present invention provides a blasting medium which has an average grain size of at most 20 $\mu$m and contains at least 90 mass % of a water-soluble inorganic salt, wherein the content of grains having grain sizes of at least 50 $\mu$m is at most 5 mass %.

The average grain size is represented by a numerical value of the average grain size based on the volume measured by means of a laser diffraction scattering grain size distribution measuring apparatus. Hereinafter, the average grain size means a value measured by this method, unless otherwise specified. Further, with respect to the representation by %, for example, when a content of grains of at least 44 $\mu$m is represented by X %, such representation means a mass proportion (X %) of a sample remaining on a sieve when a sample of 50 g is put on a sieve of a metal net with openings of 44 $\mu$m and sieved for 10 minutes by a ro-tap shaker.

For example, when smear-removing treatment after formation of via holes in a multilayer interconnection board, is carried out by a blasting method, the blasting medium to be used, is required to be able to cleanly remove smears and expose inorganic fibers and not to remain in the via holes.

The blasting medium of the present invention has an average grain size of at most 20 $\mu$m, and the content of grains having grains sizes of at least 50 $\mu$m is at most 5mass % (hereinafter referred to simply as %). Namely, it is of a size particularly suitable for smear-removing treatment of via holes of not larger than 100 $\mu$m.

Further, the blasting medium of the present invention contains at least 90% of a water-soluble inorganic salt, whereby even when a plurality of grains enter into via holes to clog them, they can be cleanly removed by washing with water.

Therefore, the blasting medium of the present invention is very effective for fine processing such as smear-removing treatment of via holes. It is thereby possible to form via holes having excellent configuration, whereby close contact between an interlayer insulation layer and a plated conductive layer is secured, and it is possible to produce a multilayer interconnection board having high reliability.

Further, the blasting medium of the present invention is also very effective for an operation of forming a pattern such as a partition wall formation in a plasma display or for an operation of removing resin burrs in resin-sealed type semiconductor devices, in the similar fine processing fields.

Thus, the blasting medium of the present invention is excellent in the work efficiency in the fine processing fields, and even when it is remained in the object to be treated, it can readily be removed.

Further, in the present invention, the above-mentioned inorganic salt is preferably sodium hydrogencarbonate and/or potassium hydrogencarbonate.

Sodium hydrogencarbonate and/or potassium hydrogencarbonate (hereinafter referred to as sodium hydrogencarbonate or the like) is suitable for blasting treatment and has a proper hardness, so that it has little possibility of giving excessive damages to the substrate or the like. Here, sodium hydrogencarbonate has no moisture absorption property and is easy to handle. However, if sodium is desired not to remain, it is preferred to use potassium hydrogencarbonate.

In the present invention, the blasting medium preferably contains an anti-caking agent having an average particle size of at most 20 μm.

The blasting medium of the present invention may undergo agglomeration when stored for a long period of time, because sodium hydrogencarbonate or the like having a small particle size, is used. Therefore, it is preferred to incorporate an anti-caking agent, whereby the blasting medium will be free from agglomeration, and it is possible to improve the work efficiency in blasting.

The anti-caking agent is preferably silica. The silica may, for example, be fumed silica or white carbon.

Further, the anti-caking agent is preferably hydrophilic silica. If the anti-caking agent is hydrophilic, the operation will be facilitated for removal of the blasting medium or for treatment of the removed waste material.

Further, the present invention provides a blasting method which comprises blasting an object to be treated, with the above-blasting medium using a fluid as a blast carrier.

Here, the fluid is meant for a gas, a liquid or the like.

DETAILED DESCRIPTION OF THE INVENTION

Now, the present invention will be described in further detail with reference to the preferred embodiments. The blasting medium of the present invention is useful, for example, for blasting treatment of via holes 7 formed in a multilayer interconnection board as shown in FIG. 1.

Figure 1:
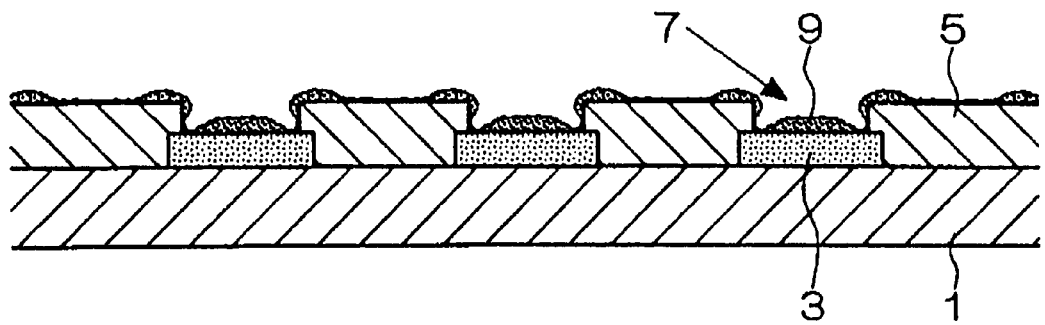
FIG. 1 shows a multilayer interconnection board having via holes formed in an interlayer insulation layer by means of a laser beam.

Referring to FIG. 1, the blast medium of the present invention is blown to the front side of a substrate 1 having smears 9 formed, using air or nitrogen gas as a carrier, to remove smears 9 attached or deposited in the interior of via holes 7 or on the peripheral portions of the via holes. With respect to the grain sizes of the blasting medium, the average grain size is at most 20 μm, and grains having grain sizes of at least 50 μm are at most 5%.

If the average grain size exceeds 20 μm and/or if the grains having grain sizes of at least 50 μm exceed 5%, especially in smear-removal treatment of via holes 7 of not larger than 150 μm, a plurality of medium particles tend to collect and clog the via holes 7, when the medium is blown, whereby efficiency in the smear-removing treatment tends to deteriorate.

Further, when the diameters of via holes 7 are further reduced, the grain sizes of the blasting medium are preferably such that grains having grain sizes of at least 30 μm is at most 5%.

Here, the largest grain size of the blasting medium is restricted to a certain level by sieving the grains by means of a sieve to remove coarse grains. For example, the largest grain size of 44 μm means a sample which has passed through a sieve when the sample is classified by a vibrating sieve of a metal net with openings of 44 μm.

The main component of the blasting medium of the present invention is not particularly limited so long as it is a water-soluble inorganic salt. However, it is particularly preferred to employ sodium hydrogencarbonate which is suitable for blast treatment and which has a proper hardness having little possibility of excessively damaging the substrate 1.

The blasting medium of the present invention can be produced by pulverizing sodium hydrogencarbonate or the like, so that the average grain size will be at most 20 μm, and grains having grain sizes of at least 50 μm will be at most 5%, and preferably, grains having grain sizes of at least 30 μm will be at most 5%. The pulverizing method may be dry pulverization or wet pulverization.

In the case of dry pulverization, it is preferred to employ an impact pulverizer, a jet mill (a pulverizer by means of a blasting air stream) or a ball mill. It is more preferred to employ an impact pulverizer equipped with a pneumatic classifier, so that sodium hydrogencarbonate or the like is pulverized while classifying grains discharged from the pulverizer and returning coarse particles again to the pulverizer, whereby it is possible to obtain sodium hydrogencarbonate or the like having the desired particle sizes in good yield.

Further, it is also preferred to employ a jet mill, since it is thereby possible to obtain sodium hydrogencarbonate or the like having the desired grain sizes in good yield without removing coarse grains by sieving.

On the other hand, in the case of wet pulverization, it is preferred to employ an agitator bead mill or a ball mill. Especially when a slurry having sodium hydrogencarbonate or the like dispersed in a liquid which does not substantially dissolve the sodium hydrogencarbonate or the like, is subjected to wet pulverization in an agitator bead mill or a ball mill, and the obtained sodium hydrogencarbonate or the like is separated and dried, it is possible to obtain sodium hydrogencarbonate or the like having a small average grain size, such being preferred.

As the liquid which does not substantially dissolve sodium hydrogencarbonate or the like, preferred is a liquid having a low viscosity, which undergoes no property change by an alkali such as sodium hydrogencarbonate or the like. As such a liquid, methanol, ethanol, acetone, 2-pentanone or $C_4F_9OCH_3$ may, for example, be mentioned.

The liquid which does not substantially dissolve sodium hydrogencarbonate or the like, is preferably one wherein the solubility of sodium hydrogencarbonate or the like is at most 3%, more preferably the solubility is at most 1%.

In the blasting medium of the present invention, a water-soluble inorganic salt having a small grain size is employed, and it may agglomerate when stored for a long period of time. Such agglomeration tends to lead to clogging of a transportation pipeline for the medium, whereby the work efficiency in blasting is likely to be substantially lowered. Accordingly, it is preferred to add an anti-caking agent.

The anti-caking agent may, for example, be silica, basic magnesium carbonate, calcium carbonate or diatomaceous earth. Silica may, for example, be fumed silica or white carbon. Among them, very fine silicic anhydride so-called fumed silica is particularly preferred, since it is effective even in a small amount. Especially, fumed silica subjected to hydrophobic treatment is preferred, since high fluidity can be imparted by its addition in a small amount.

On the other hand, in the removal of the blasting medium of the present invention or in the treatment of the removed waste material, the operation may be facilitated when the anti-caking agent is hydrophilic, depending upon the process to be employed. Namely, the water-soluble inorganic salt can readily be removed by washing with water, since it readily dissolves in water, and when it is dissolved in water, it does not float on the water surface, whereby neutralization by an acid is easy, and bubbles formed during the neutralization will readily diminish, and the anti-caking agent itself will also readily be dispersed in water and can readily be removed. If fumed silica subjected to hydrophobic treatment, is used, when it is dissolved in water, the anti-caking agent itself or the water-soluble inorganic salt having the anti-caking agent deposited thereon, tends to float on water, whereby the neutralization operation tends to be difficult. Further, when neutralized with e.g. hydrochloric acid, bubbles formed tend to hardly diminish, and the bubbles are likely to fill the interior of the neutralization equipment, thus leading to a trouble.

With respect to the amount of the anti-caking agent, the optimum amount varies depending upon the degree of pulverization of sodium hydrogencarbonate or the like or the condition for storage. However, it is usually preferably at least 0.1% and less than 10%, based on the total amount of the blasting medium including the anti-caking agent. Further, the average particle size of the anti-caking agent is preferably equal to or smaller than the average grain size of the blasting medium, and it is preferably at most 20 $\mu$m, more preferably at most 10 $\mu$m.

Depending upon the type of the blasting medium, the blasting method may, for example, be dry blasting, wet blasting or water jet blasting.

The dry blasting method employing a gas as the blast carrier is preferably employed for treatment of an object to be treated which disfavors water or when the blasting medium is used by recycling.

The blast carrier to be used for the dry blasting method is not particularly limited, but it is preferred to employ commonly used air, nitrogen or carbon dioxide. With respect to the blast pressure of the blast carrier in the dry blasting method or the wet blasting method, the higher the pressure, the higher the smear-removal rate and the shorter the treating time. However, if the pressure is increased excessively, damages to the substrate is likely to result due to the impact force or generation of the frictional heat. The blast pressure is preferably from 0.05 to 0.5 MPa.

Further, the blasting medium of the present invention is suitable also for use in the water jet blasting method. By the use of the blasting medium of the present invention, a very high treating efficiency can be obtained. In this case, dissolution of the blasting medium in the solvent can be prevented by using a circulated solution of sodium hydrogencarbonate or the like or by reducing the solubility of sodium hydrogencarbonate or the like by mixing an alcohol such as ethanol when water is used, or by employing a solvent which does not substantially dissolve sodium hydrogencarbonate or the like, whereby the blasting effects can be maintained at a high level. However, even if the solvent is water only, treatment can adequately be made although the treating time may be long. Further, when $C_4F_9OCH_3$ is used, it is non-flammable and easy to handle. For the removal of the blasting medium by washing, washing with water or washing with an acid is preferably employed. The blast pressure in the water jet blasting method is preferably from 1 to 10 MPa.

The following method is preferably employed as a blasting method for treating smears formed during formation of via holes 7 in the multilayer interconnecting board by means of the blasting medium of the present invention. Namely, the substrate 1 transported into a blasting chamber is subjected to the blasting medium of the present invention jetted from a nozzle, whereby smears 9 or exposed inorganic fibers deposited in via holes 7 are blasted off. The jetted blasting medium will be suctioned together with removed smears 9 and exposed inorganic fibers from the blasting chamber by suction fans and classified by a cyclone. Reusable blasting medium collected by the cyclone, will be recovered and re-used as recycled to the blasting medium feeding line.

On the other hand, broken non-reusable blasting medium which has not been collected by the cyclone, removed smears 9 and exposed inorganic fibers, will be collected in a dust collecting equipment such as a bag filter and discharged out of the system. The substrate 1 treated by blasting is subjected to air blowing to remove foreign matters attached to the surface and then further subjected to e.g. shower cleaning or ultrasonic cleaning to remove foreign matters remaining in the via holes 7, and then, it is sent to the next step of plating treatment.

As described in the foregoing, the blasting method employing the blasting medium of the present invention is very effective for removal of smears 9 or exposed inorganic fibers in the via holes 7.

Further, the blasting method employing the blasting medium of the present invention is capable of properly roughening the surface of the side walls of via holes 7 and the surface of the interlayer insulation layer 5, whereby the adhesive strength for plating treatment can be increased, and it is possible to form a conductive layer excellent in the adhesion.

Further, the blasting method employing the blasting medium of the present invention is effective also for formation of conductive portions to electrically connect a plurality of wiring pattern layers, such as through-holes or conductive portions of groove-shape.

Use of the blasting medium of the present invention and the blasting method employing it, is not limited to the above-mentioned smear-removing treatment after formation of via holes 7 in the production of a multilayer interconnection board, but they are useful also for other uses such as an operation for forming a pattern such as removal of a partition wall material layer for the formation of partition walls in the method for producing a plasma display panel, and an operation for removing resin burrs to be formed during resin sealing in a process for producing a resin sealed semiconductor device. Further, they can effectively be used for roughening of the surface of a soft metal material such as copper or aluminum.

Figure 2:
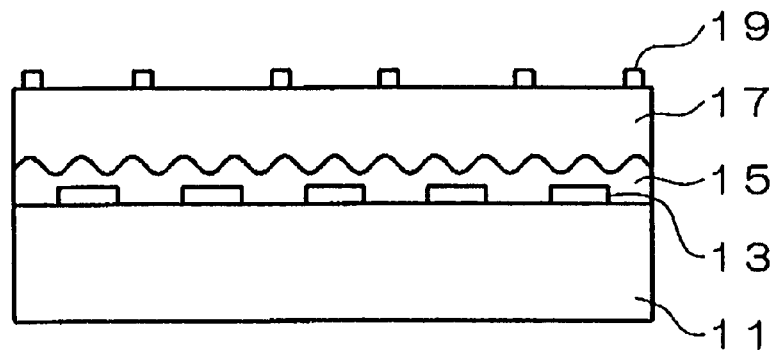
FIG. 2 illustrates a manner of forming partition walls in the production of a plasma display panel.

FIG. 2 illustrates a manner of forming partition walls in the production of a plasma display panel. Referring to FIG. 2, address electrodes 13 are formed on an insulating substrate 11 made of e.g. glass, by a vapor deposition method. Further, a dielectric layer 15 and a partition wall material layer 17 are formed thereon, and further, a mask 19 is disposed on the partition wall material layer 17.

Figure 3:
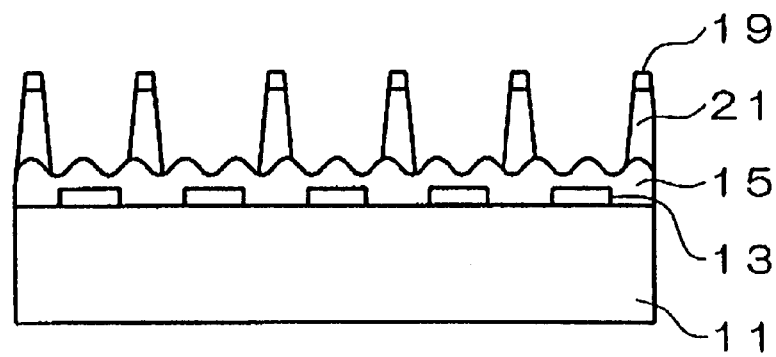
FIG. 3 illustrates a manner of removing a partition wall material layer at a position other than the positions where masking treatment has been applied to form partition walls.

Then, blast treatment is carried out by means of the blasting medium of the present invention, whereby, as shown in FIG. 3, the partition wall material layer 17 other than the positions at which masking treatment was applied, can be removed very efficiently to form partition walls 21. Further, the blasting medium of the present invention is applicable in a similar manner also to an operation of removing resin burrs formed during the resin sealing in a method for producing a resin sealed semiconductor device. For example, a semiconductor chip is packaged with a mold resin in order to protect the semiconductor chip attached to a lead frame. This mold resin package is formed by disposing the lead frame having the semiconductor chip attached thereto, in a cavity formed in a predetermined shape in a mold and injecting a mold resin to embed the semiconductor chip in the resin. At that time, if the mold resin is a transparent epoxy resin or the like, as the epoxy resin contains no filler, the epoxy resin penetrates into a space of a parting portion between the fixed mold and a movable mold constituting the entire mold, whereby resin burrs are formed around the mold resin package. Such resin burrs must be removed since they present various adverse effects in the production steps subsequent to the molding step. By the blast treatment employing the blasting medium of the present invention, it is possible to remove the resin burrs very efficiently and completely.

Further, in the removal of burrs or polishing of a metal made of e.g. aluminum or magnesium, a powder of e.g. aluminum or magnesium is flammable, but sodium hydrogencarbonate or the like has a fire extinguishing property. Accordingly, as compared with other materials for blasting medium, it is preferred to use such sodium hydrogencarbonate or the like as a blasting medium, from the viewpoint of safety. Especially for blast treatment of a magnesium material, blasting by a water jet blasting method prevents ignition of the magnesium metal powder, such being particularly preferred.

The fine blasting medium of the present invention is useful for cleaning an object such as a printing roll where impressed patterns are fine and a conventional coarse particle medium is hardly applicable. Especially, the Moh's hardness of sodium hydrogencarbonate is low, whereby it presents no damage to the base material of e.g. the roll. Further, it is water-soluble, whereby the deposited medium can easily be removed by washing with water.

Now, the present invention will be described with reference to Examples. However, it should be understood that the present invention is by no means restricted to such specific Examples.

Smear-removing treatment in the production of a multilayer interconnection board will be described by the following Examples. In Examples 1 and 3 of the present invention, sodium hydrogencarbonate was used as the blasting medium, but treatment can be likewise carried out with potassium hydrogencarbonate.

EXAMPLE 1

An interlayer insulation composition comprising a bisphenol A type epoxy resin as the main component, was screen-printed on a glass cloth/epoxy resin laminated substrate 1 having a thickness of 1 mm and having a copper wiring pattern preliminarily formed, by means of a polyester screen of 100 mesh/inch, so that the film thickness after drying would be 50 μm, to form a coating film.

This coating film was heat-cured at 150° C. for 40 minutes to form an interlayer insulation layer 5. Then, to this interlayer insulation layer 5, via holes 7 having a diameter of 70 μm were formed by means of a carbon dioxide gas laser beam of short pulse.

Then, a powder (average grain size: 8.0 μm, and the maximum grain size: 20 μm) comprising 98% of one obtained by dry pulverization of sodium hydrogencarbonate having a particle size of 95 μm and 2.0% of hydrophilic fumed silica (REOLOSIL QS-102, manufactured by Tokuyama Corp.) as an anti-caking agent, was used as a blasting medium, and blasting treatment was applied to via holes 7 for 20 seconds under a blast pressure of 0.3 MPa using air as the blast carrier. Thereafter, via holes 7 were washed with pure water and dried.

After the treatment, the via holes 7 were inspected, whereby smears 9 in the holes and on the peripheral portions of the holes were found to be clearly removed, and a very good result was obtained. Further, no residue of the blasting medium was observed. The blasting medium deposited around the treated portion, was removed by washing with water. Further, the blasting medium after the treatment, was dissolved in the washing water, and the pH was less than 9, whereby the waste water would be disposed after removing polishing debris by filtration.

EXAMPLE 2 (COMPARATIVE EXAMPLE)

The treatment was carried out in the same manner as in Example 1 except that as the blasting medium, silicon carbide having an average grain size of 8.2 μm and the maximum grain size of 20 μm, was used, and blast treatment was carried out for 20 seconds under a blast pressure of 0.3 MPa using air as the blast carrier.

Then, via holes 7 were inspected, whereby smears 9 in the holes and on the peripheral portions of the holes were cleanly removed, and a very good result was obtained. However, deposition of a residue of silicon carbide grains as the blasting medium was observed in some of via holes 7.

EXAMPLE 3

A glass fiber/epoxy resin prepreg was vacuum-press bonded on a glass fiber/epoxy resin laminated plate having a thickness of 1 mm and having a copper wiring pattern previously formed, so that the thickness after pressing/heat curing would be 1.2 mm. Then, pressing/heat curing were carried out at 200°C. for 30 minutes while exerting a pressure of 0.5 MPa.

Then, via holes 7 having a diameter of 100 μm were formed therein by means of a carbon dioxide gas laser beam with short pulse, whereby the epoxy resin portion was removed, but the glass fibers were exposed in via holes 7.

Then, using the same blasting medium as in Example 1, blasting treatment was carried out for 40 seconds under a blast pressure of 0.3 MPa using air as the blast carrier. After the treatment, via holes 7 were inspected, whereby epoxy resin smears and exposed glass fibers were found removed, and the configulation of via holes 7 was excellent.

EXAMPLE 4 (COMPARATIVE EXAMPLE)

In Example 3, after forming via holes 7 having a diameter of 100 μm, the via holes 7 were treated with a dichromic acid/sulfuric acid/sodium fluoride mixed liquid, to carry out the operation for removal of epoxy resin smears and exposed glass fibers. It was possible to remove smears 9, but it was impossible to completely remove the exposed glass fibers.

EXAMPLE 5 (COMPARATIVE EXAMPLE)

Treatment of via holes 7 was carried out in the same manner as in Example 3 except that as the blasting medium, sodium hydrogencarbonate having an average grain size of 95 μm and the maximum grain size of 250 μm, was used, and blasting treatment was carried out for 30 seconds under a blast pressure of 0.3 MPa using air as the blast carrier.

Then, via holes 7 were inspected, whereby residues of the epoxy resin smears and exposed fibers were observed in the holes and on the peripheral portions of the holes, and thus the effects of blasting treatment were inadequate.

EXAMPLE 6

Blasting treatment was carried out in the same manner as in Example 1 except that the fumed silica was changed to hydrophobic one (REOLOSIL MT-10, manufactured by Tokuyama Corp.).

Finishing was as good as in Example 1. On the other hand, the blasting medium dissolved in washing water after the treatment, was found to be partially floating on water, and the water was discharged after removing the floating media together with the polishing debris by filtration.

As described in the foregoing, the blasting medium of the present invention is excellent in the work efficiency in fine processing fields, and even when it remains on the object treated, it can readily be removed. Further, when sodium hydrogencarbonate or the like is employed as the blasting medium, such a system is suitable for blasting treatment, and a possibility of presenting excessive damages to the substrate or the like is little.

The entire disclosure of Japanese Patent Application No. 11-86343 filed on Mar. 29, 1999 including specification, claims, drawings and summary are incorporated herein by reference in its entirety.

What is claimed is:

1. A blasting medium, comprising:
grains which have an average grain size of not more than 20 μm and contain at least 90 mass % of a water-soluble inorganic salt, wherein a content of grains having a grain size of at least 50 μm is not more than 5 mass %.

2. The according to claim 1, wherein the inorganic salt is sodium hydrogencarbonate, potassium hydrogencarbonate or a combination thereof.

3. The according to claim 1, further comprising:
an anti-caking agent having an average particle size of not more than 20 μm.

4. The blasting medium according to claim 3, wherein the anti-caking agent is contained in an amount of from 0.1 to 10% of the total mass of the blasting medium.

5. The blasting medium according to claim 3, wherein the anti-caking agent is silica.

6. The blasting medium according to claim 3, wherein the anti-caking agent is hydrophilic silica.

7. A blasting method which comprises:
blasting an object to be treated with a blasting medium using a fluid as a blast carrier;
wherein said blasting medium has an average grain size of not more than 20 μm and contains at least 90 mass % of a water-soluble inorganic salt;
wherein the content of grains having grain sizes of at least 50 μm is not more than 5 mass %.

8. The blasting method according to claim 7, wherein the inorganic salt is sodium hydrogencarbonate, potassium hydrogencarbonate or a combination thereof.

9. The blasting method according to claim 7, wherein said blasting medium contains an anti-caking agent having an average particle size of not more than 20 μm.

10. The blasting method according to claim 9, wherein the anti-caking agent is contained in an amount of from 0.1 to 10% of the total mass of the blasting medium.

11. The blasting method according to claim 9, wherein the anti-caking agent is silica.

12. The blasting method according to claim 9, wherein the anti-caking agent is hydrophilic silica.

13. The blasting method according to claim 12, wherein after blasting the object to be treated, with the blasting medium, the object to be treated is washed with water to remove the blasting medium.

14. The blasting method according to claim 7, wherein the blast carrier is air, nitrogen or carbon dioxide, and the blasting medium is blown by a dry blasting method.

15. The blasting method according to claim 7, wherein a blast pressure is from 0.05 to 0.5 Mpa.

16. The blasting method according to claim 7, wherein the object to be treated is a via hole for electrically connecting an upper layer wiring pattern and a lower layer wiring pattern in a multilayer interconnection board.

17. A blasting medium, consisting of:
grains which have an average grain size of not more than 20 μm and contain at least 90 mass % of a water-soluble inorganic salt, wherein a content of grains having a grain size of at least 50 μm is not more than 5 mass %;
wherein the inorganic salt is sodium hydrogencarbonate, potassium hydrogencarbonate or a combination thereof.

* * * * *